United States Patent
Yoon

(10) Patent No.: US 9,985,084 B2
(45) Date of Patent: May 29, 2018

(54) FLAT DISPLAY DEVICE WITH LIGHT SHIELDING LAYER

(75) Inventor: Joong-Sun Yoon, Jung-ri (KR)

(73) Assignee: LG DISPLAY CO., LTD., Seoul (KR)

( * ) Notice: Subject to any disclaimer, the term of this patent is extended or adjusted under 35 U.S.C. 154(b) by 330 days.

(21) Appl. No.: 12/853,680

(22) Filed: Aug. 10, 2010

(65) Prior Publication Data

US 2011/0109596 A1 May 12, 2011

(30) Foreign Application Priority Data

Nov. 6, 2009 (KR) .................. 10-2009-0107228

(51) Int. Cl.
| | | |
|---|---|---|
| G09G 3/36 | (2006.01) | |
| H01L 27/32 | (2006.01) | |
| H01L 51/52 | (2006.01) | |
| G09G 3/3225 | (2016.01) | |

(52) U.S. Cl.
CPC ....... H01L 27/3272 (2013.01); G09G 3/3225 (2013.01); H01L 51/524 (2013.01); H01L 51/5253 (2013.01); H01L 51/5259 (2013.01); G09G 2340/14 (2013.01); H01L 51/529 (2013.01)

(58) Field of Classification Search
CPC ......... G02F 1/133512; G02F 1/136209; H01L 51/5284; H01L 51/5246; H01L 29/78633; H01L 51/5237; H01L 5/156; H01L 27/32; H01L 51/5259; H01L 27/3276; C03C 17/40; C03C 2218/34; Y10S 428/917; H05B 33/04; H01J 1/62; G09G 3/20

USPC .......... 313/506, 511, 512; 345/55, 87; 257/347; 349/153; 315/169.3
See application file for complete search history.

(56) References Cited

U.S. PATENT DOCUMENTS

| | | | | |
|---|---|---|---|---|
| 5,261,013 | A | * | 11/1993 | Murata et al. ............... 358/471 |
| 7,495,644 | B2 | * | 2/2009 | Hirakata ............ H01L 51/5259 345/87 |
| 7,560,863 | B2 | * | 7/2009 | Chung et al. ................ 313/506 |
| 7,615,923 | B2 | * | 11/2009 | Lee et al. .................... 313/506 |
| 7,745,992 | B2 | * | 6/2010 | Ko ................................ 313/506 |

(Continued)

FOREIGN PATENT DOCUMENTS

| | | |
|---|---|---|
| CN | 1435813 A | 8/2003 |
| CN | 1532592 | 9/2004 |

(Continued)

OTHER PUBLICATIONS

Office Action and Search Report issued in corresponding Chinese Patent Application No. 201010509949.6, dated Sep. 6, 2012.

(Continued)

*Primary Examiner* — Abdul-Samad A Adediran
(74) *Attorney, Agent, or Firm* — Seed IP Law Group LLP

(57) ABSTRACT

A flat display device in which a semi-transparent non-display area is processed to be non-transparent for preventing a display area from being reduced and fabricating a thinner flat display device is disclosed. The flat display device includes a first substrate having a display area with a pixel matrix formed therein and a non-display area with a driving circuit for driving the pixel matrix formed therein, a second substrate bonded to the first substrate with sealant, and a light shielding layer formed on the second substrate for making the non-display area non-transparent.

11 Claims, 6 Drawing Sheets

(56) References Cited

U.S. PATENT DOCUMENTS

| | | | |
|---|---|---|---|
| 8,228,301 B2* | 7/2012 | Schneider | 345/173 |
| 2004/0012747 A1* | 1/2004 | Yamazaki | H01L 27/32 349/153 |
| 2004/0105140 A1* | 6/2004 | Fujita | 359/245 |
| 2004/0135496 A1* | 7/2004 | Park et al. | 313/504 |
| 2004/0245641 A1* | 12/2004 | Eguchi | 257/758 |
| 2005/0212997 A1* | 9/2005 | Goto et al. | 349/110 |
| 2006/0125364 A1* | 6/2006 | Takeda et al. | 313/46 |
| 2007/0128738 A1* | 6/2007 | Kobayashi et al. | 438/8 |
| 2007/0176554 A1* | 8/2007 | Kwak | C03C 8/24 313/512 |
| 2007/0184229 A1* | 8/2007 | Jeong | 428/40.1 |
| 2007/0187759 A1* | 8/2007 | Lee | H01L 51/56 257/347 |
| 2008/0036388 A1* | 2/2008 | Jung | H01L 27/3276 315/169.3 |
| 2008/0211398 A1* | 9/2008 | DeCook | H01L 51/529 313/506 |
| 2008/0211402 A1* | 9/2008 | DeCook | H01L 51/5237 313/511 |
| 2009/0153438 A1* | 6/2009 | Miller | G06F 3/0488 345/55 |
| 2010/0244682 A1* | 9/2010 | Lee | H01L 27/323 313/512 |
| 2010/0277684 A1* | 11/2010 | Fukushima et al. | 349/158 |
| 2011/0018416 A1* | 1/2011 | Sassa | 313/45 |
| 2011/0109596 A1* | 5/2011 | Yoon | 345/204 |
| 2011/0148834 A1* | 6/2011 | Baek | 345/207 |
| 2011/0216272 A1* | 9/2011 | Yoshida et al. | 349/84 |

FOREIGN PATENT DOCUMENTS

| | | |
|---|---|---|
| CN | 1691851 A | 11/2005 |
| CN | 1808231 A | 7/2006 |
| CN | 200944280 Y | 9/2007 |
| KR | 1020090069558 A | 7/2009 |
| KR | 1020090114964 A | 11/2009 |

OTHER PUBLICATIONS

Office Action issued in corresponding Korean Patent Application No. 10-2009-0107228, dated Mar. 25, 2013.

Office Action issued in corresponding Chinese Patent Application No. 201010509949.6, dated Apr. 26, 2013.

Search Report issued in corresponding Chinese Patent Application No. 201010509949.6, dated Apr. 26, 2013.

* cited by examiner

FLAT DISPLAY DEVICE WITH LIGHT SHIELDING LAYER

This application claims the priority and the benefit under 35 U.S.C. § 119(a) on Patent Application No. 10-2009-0107228 filed in Republic of Korea on Nov. 6, 2009 the entire contents of which are hereby incorporated by reference.

BACKGROUND

Field of the Invention

The present invention relates to flat display devices, and more particularly, to a flat display device in which a semi-transparent non-display area is processed to be non-transparent for preventing a display area from being reduced and fabricating a thinner flat display device.

Discussion of the Related Art

In the flat display devices used widely, there are liquid crystal display devices LCD, plasma display panel devices PDP, field emission display devices FED, organic light emitting diode OLED display devices, and so on. Of the variety of flat display devices, the organic light emitting diode display device which can be fabricated thin like a sheet of paper is a spontaneous light emitting device which is advantageous in that luminance is higher than other flat display devices, a responsive speed is high, driving voltage is low, and an extra thin device can be fabricated.

The organic light emitting diode OLED display device is provided with a device substrate having a display area (an active region) with a plurality of pixels formed therein and a non-display area (Bezel area) on an outer side thereof with a driving circuit formed therein and an encapsulation substrate bonded with sealant. Each of the pixels at the display area is provided with an organic light emitting diode having an organic light emitting layer between an anode and a cathode, and a sub-pixel driving unit for driving the organic light emitting diode independently. The sub-pixel driving unit controls a current to the organic light emitting diode in response to a data signal for controlling a luminance of the organic light emitting diode.

In the meantime, referring to FIG. 1A, a related art OLED display device has a problem in that a dark line is formed in the non-display area around the display area where the driving circuit is formed, making an inside of the non-display area appears dark semi-transparently. Referring to FIG. 1B, in order to solve the problem of the dark line at the non-display area 6, though a size of an outside cabinet CB which surrounds the OLED display panel can be increased to cover the non-display area, since the outside cabinet CB encroaches upon the display area as the size of the outside cabinet CB increases, the increase of the size of the outside cabinet CB has a problem in that the display area DA is reduced and the fabrication of a thinner display device is restricted.

The problem of the dark line at the non-display area can take place, not only in the OLED display device, but also in other spontaneous display devices in the same fashion.

BRIEF SUMMARY

A flat display device includes a first substrate having a display area with a pixel matrix formed therein and a non-display area with a driving circuit for driving the pixel matrix formed therein, a second substrate bonded to the first substrate with sealant, and a light shielding layer formed on the second substrate for making the non-display area non-transparent.

In another aspect, a flat display device includes a first substrate having a display area with a pixel matrix formed therein and a non-display area with a driving circuit for driving the pixel matrix formed therein, a second substrate bonded to the first substrate with sealant, a heat dissipation sheet attached to an outside surface of the second substrate, and a light shielding layer formed at either the second substrate or the heat dissipation sheet for making the non-display area non-transparent.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DRAWINGS AND THE PRESENTLY PREFERRED EMBODIMENTS

Reference will now be made in detail to the specific exemplary embodiments of the present invention, examples of which are illustrated in the accompanying drawings. Wherever possible, the same reference numbers will be used throughout the drawings to refer to the same or like parts.

Figure 1A:
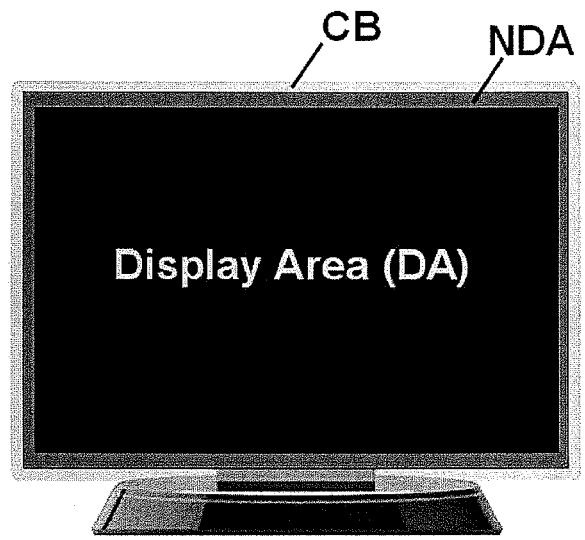
FIGS. 1A and 1B illustrate diagrams showing a dark line problem and a display area reduction problem of a related art OLED display device, respectively.
Figure 1B:
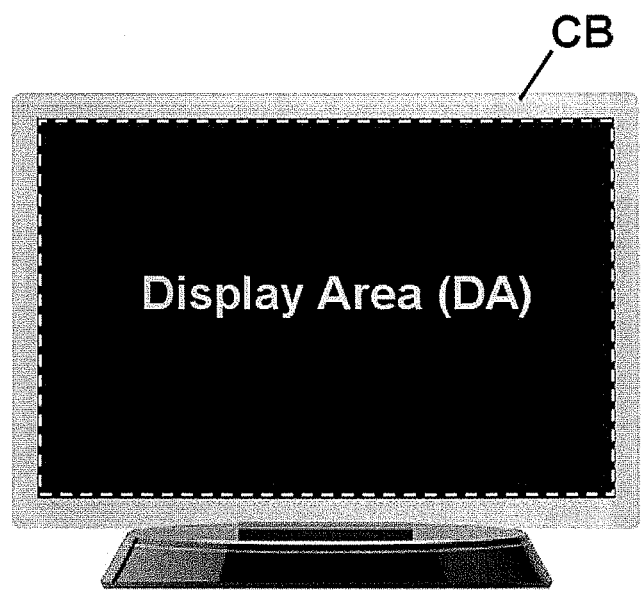
Figure 2:
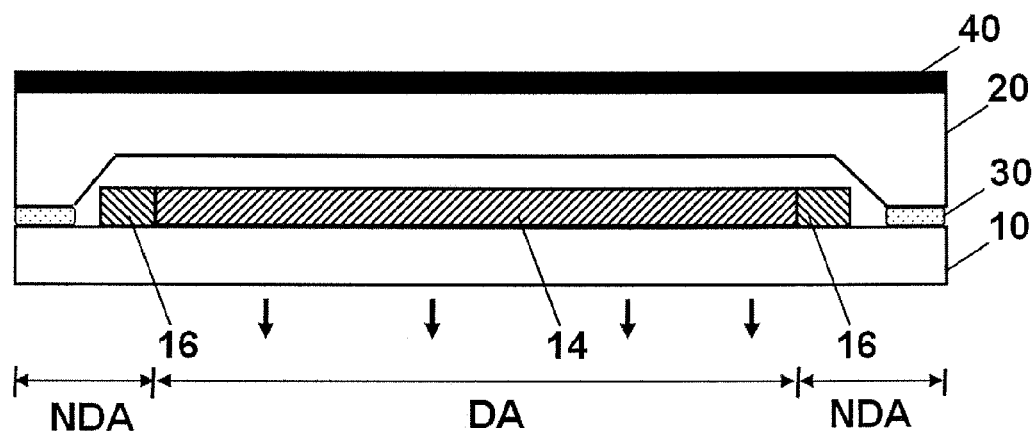
FIG. 2 illustrates a section of an OLED display device in accordance with a preferred embodiment of the present invention, schematically.
Figure 3:
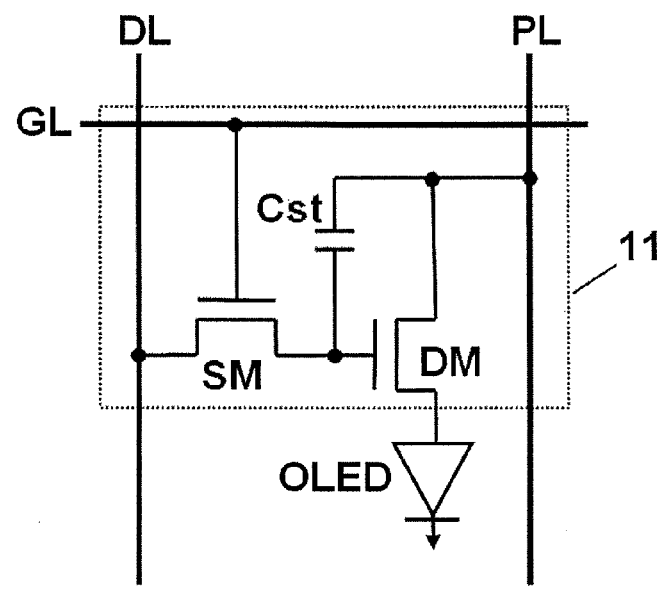
FIG. 3 illustrates an equivalent circuit of a sub-pixel in the pixel matrix in FIG. 2.
Figure 4:
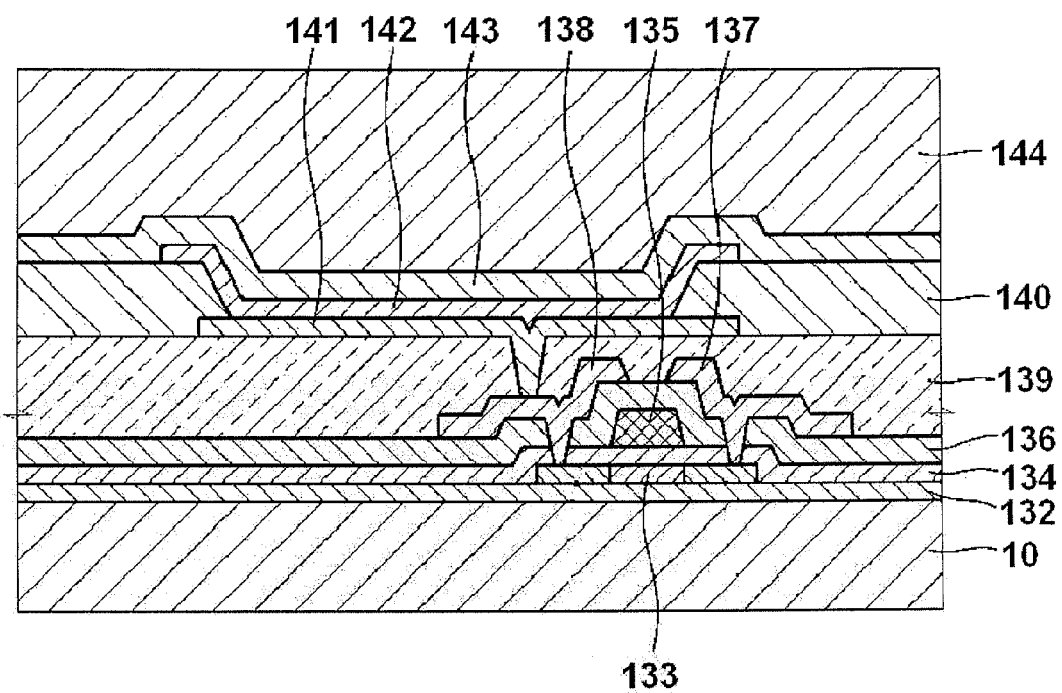
FIG. 4 illustrates a section of a sub-pixel in the pixel matrix in FIG. 2.

FIG. 2 illustrates a section of an OLED display device in accordance with a preferred embodiment of the present invention schematically, and FIGS. 3 and 4 illustrate an equivalent circuit and a section of a sub-pixel in the pixel matrix in FIG. 2, respectively."

Referring to FIG. 2, the OLED display device includes a device substrate (a first substrate) 10 and an encapsulation substrate (a second substrate) 20 bonded with sealant 30, and a light shielding layer 40 formed on the encapsulation substrate 20.

Formed on the device substrate 10, there are a pixel matrix 14 and a driving circuit 16. The device substrate 10 has a display area (active area) DA having the pixel matrix 14 formed thereon and a non-display area NDA (bezel area) on an outer side of the display area 12 having the driving circuit 16 formed thereon.

The display area DA displays a picture by means of the pixel matrix 14 having a plurality of pixels arranged thereon. The driving circuit 16 at the non-display area NDA is formed by the same a fabrication process as the pixel matrix 14, for driving the pixel matrix 14. For an example, the driving circuit 16 includes a gate driving circuit for driving gate lines in the pixel matrix 14, and a data driving circuit for driving data lines in the pixel matrix 14, additionally.

The pixels of the pixel matrix 14 in the display area DA produce a color with a combination of red/green/blue sub-pixels. As shown in FIG. 2, each of the sub-pixels includes an OLED device, and a sub-pixel driving unit 11 for driving the OLED device, independently. A structure of the sub-pixel driving unit 11 is not limited to a structure shown in FIG. 2, but the sub-pixel driving unit 11 can have various structures.

Referring to FIG. 3, the sub-pixel driving unit 11 includes at least two thin film transistors SM and DM and a storage capacitor connected to the gate line GL, the data line DL, a power line PL, and the OLED device. The switching and driving transistors SM and DM are PMOS or NMOS transistors. The switching transistor SM is turned on in response to a gate turn-on voltage supplied to the gate line GL to charge a data signal supplied to the data line DL at the storage capacitor Cst as a difference voltage of the data signal from a driving voltage VDD. The driving transistor DM supplies a driving current of the difference voltage charged at the storage capacitor Cst for making the OLED device to emit a light. The OLED device emits the light in proportion to a current supplied thereto from the driving transistor DM.

Referring to FIG. 4, the driving thin film transistor DM on the device substrate 10 includes a semiconductor layer 33 on a buffer layer 132, a gate electrode 135 overlapped with the semiconductor layer 33 with a gate insulating film 134 on the semiconductor layer 33 disposed therebetween, and a source electrode 137 and a drain electrode 138 in contact with the semiconductor layer 33 through contact hole passed through an interlayer insulating film 136 and the gate insulating film 134. The driving thin film transistor DM may be formed in a poly-Si type using poly-silicon or an amorphous-Si type using amorphous silicon as a semiconductor layer 33 as shown in FIG. 4 by a process identical to a process for fabricating the switching thin film transistor SM shown in FIG. 3 and the thin film transistors in the driving circuit 16 shown in FIG. 2.

Referring to FIG. 4, the OLED device includes a first electrode 141 in contact to a drain electrode 138 through a contact hole passed through an organic insulating film 139, an organic luminescence layer 143 formed on the first electrode 141 through a pixel hole passed through a bank insulating film 140 on the first electrode 141, and a second electrode 143 formed on at least one protective film 144. One of the first and second electrodes 141 and 143 serves as an anode and the other one of the first and second electrodes 141 and 143 serves as cathode, wherein, in an equivalent in FIG. 2, the first electrode 141 serves as an anode and the second electrode 143 serves as a cathode. The organic luminescence layer includes a hole injection layer, a hole transport layer, a luminescence layer, an electron transport layer, and an electron injection layer. If a forward direction voltage is applied to a portion between the first and second electrodes 141 and 141 owing to a driving current from the driving thin film transistor DM, an electron moves from the second electrode (cathode) 143 to the luminescence layer through the electron injection layer and the electron transport layer, and the hole moves from the first electrode (anode) 141 to the organic luminescence layer 142 through the hole injection layer, and the hole transport layer. The organic luminescence layer 142 emits the light as the electron from the electron transport layer and the hole from the hole transport layer re-unite. The light travels to an outside of the OLED device through a light emission surface of the device substrate 10.

The encapsulation substrate 20 is bonded to the device substrate 10 with sealant 30n to face an inside of the device substrate 10. The sealant 30 and the encapsulation substrate 20 suppress infiltration of moisture and gas into the OLED display device for protecting an inside of the device substrate 10. As shown in FIG. 2, the sealant 30 may be formed at a peripheral portion of a space between the device substrate 10 and the encapsulation substrate 20 as shown in FIG. 2, i.e., a peripheral portion of the non-display area, or an entire surface of the space between the device substrate 10 and the encapsulation substrate 20.

The light shielding layer 40 is formed on an outside surface (back surface) of the encapsulation substrate 20 for shielding the light to make the non-display area NDA of the device substrate 10 non-transparent. Accordingly, by preventing the non-display area NDA of the device substrate 10 from being seen semi-transparently at a light emission surface of the device substrate 10, the light shielding layer 40 can prevent the display area from reducing and improve a display quality. The light shielding layer 40 may be formed of a non-transparent material, such as metal, like chromium Cr, or molybdenum Mo having a relatively low reflectivity, a non-transparent inorganic insulating material such as CrOx or MoOx, or a non-transparent organic insulating material, such as a black resin. The light shielding layer 40 is formed as a light shielding film or a light shielding sheet and attached to an outside surface of the encapsulation substrate 20. Different from this, the light shielding layer 40 may be formed as a part of a heat dissipation sheet attached to the outside of the encapsulation substrate 20, or formed to the outside surface or an inside surface of the encapsulation substrate 20 directly, or formed at a part of the encapsulation substrate 20 opposite to the non-display area NDA of the device substrate 10, directly.

FIGS. 5 to 8 illustrate OLED display devices respectively having the light shielding layers 40 in accordance with preferred embodiments of the present invention, schematically.

Figure 5:
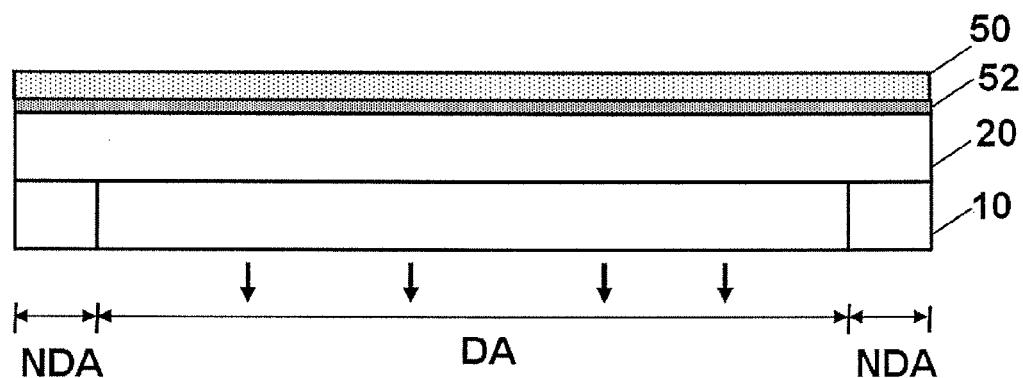
FIG. 5 illustrates a section of an OLED display device in accordance with a preferred embodiment of the present invention, schematically.

Referring to FIG. 5, there is a heat dissipation sheet 50 attached to an outside surface of the encapsulation substrate 20 bonded to the device substrate 10 with an adhesive 52. The heat dissipation sheet 50 dissipates heat transmitted from the device substrate 10 that is a heat source to the encapsulation substrate 20 in a surface direction or a thickness direction, thereby making effective heat dissipation from the OLED display device. The heat dissipation sheet 50 is formed of an isotropic material, such as copper Cu, aluminum Al and silicon Si, or anisotropic material formed by expanding graphite into a sheet form. By processing the heat dissipation sheet 50 and/or the adhesive 52 (two-sided tape) to be black so as to be non-transparent, a service of the light shielding layer is given thereto. In other words, by depositing a light shielding material on a surface of the heat dissipation sheet 50 to treat the surface of the light shielding layer to be black, the heat dissipation sheet 50 can serve as the light shielding layer. Or/and, by using a black adhesive 52 containing a non-transparent material in bonding the heat dissipation sheet 50 to the light shielding layer, the adhesive 52 can serve as the light shielding layer. Thus, if heat dissipation sheet 50 and/or the adhesive 52 serves as the light shielding layer, no additional light shielding layer is required, thereby reducing a number of components.

Figure 6:
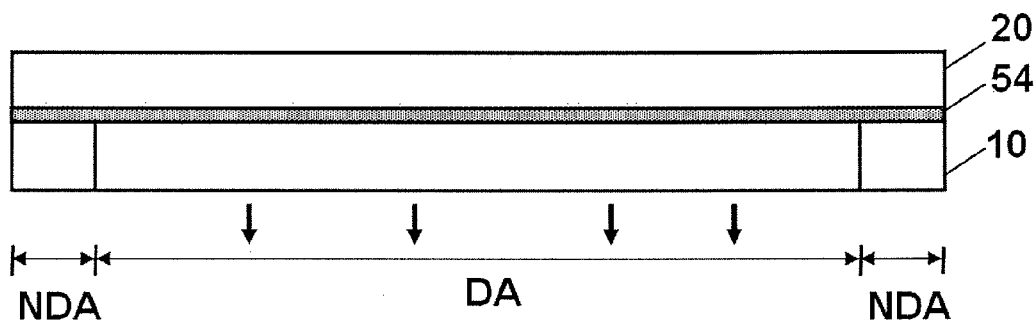
FIG. 6 illustrates a section of an OLED display device in accordance with another preferred embodiment of the present invention, schematically.
Figure 7:
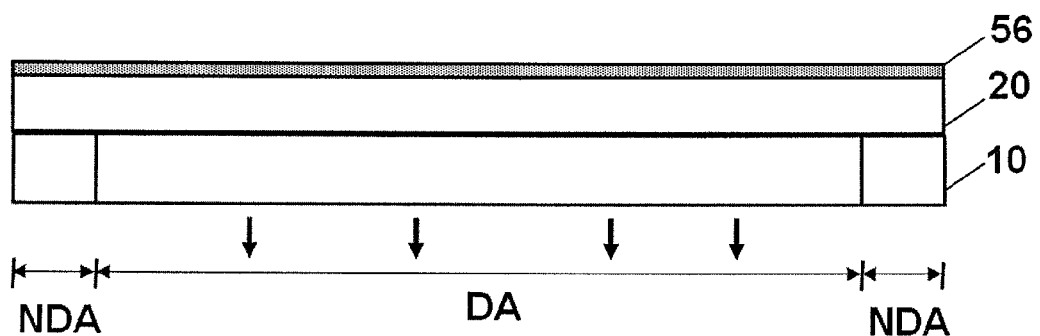
FIG. 7 illustrates a section of an OLED display device in accordance with another preferred embodiment of the present invention, schematically.
Figure 8:
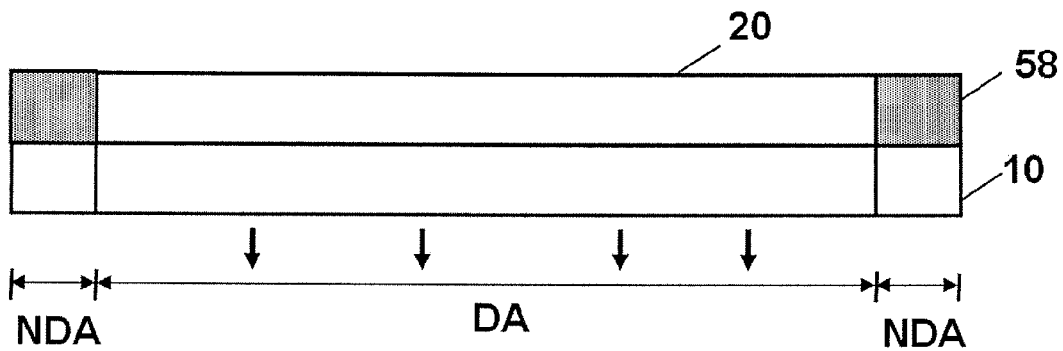
FIG. 8 illustrates a section of an OLED display device in accordance with another preferred embodiment of the present invention, schematically.

Referring to FIG. 6, there is a light shielding layer 54 formed by depositing or printing a light shielding material on an inside surface (front surface) of the encapsulation substrate 20 bonded to the device substrate 10. Different from this, as shown in FIG. 7, a light shielding layer 56 is formed by depositing or printing a light shielding material on an outside surface of the encapsulation substrate 20. Or, as shown in FIG. 8, a light shielding layer 58 is formed by depositing or printing a light shielding material only on a peripheral portion of the encapsulation substrate 20 opposite to the non-display area NDA of the device substrate 10.

Figure 9A:
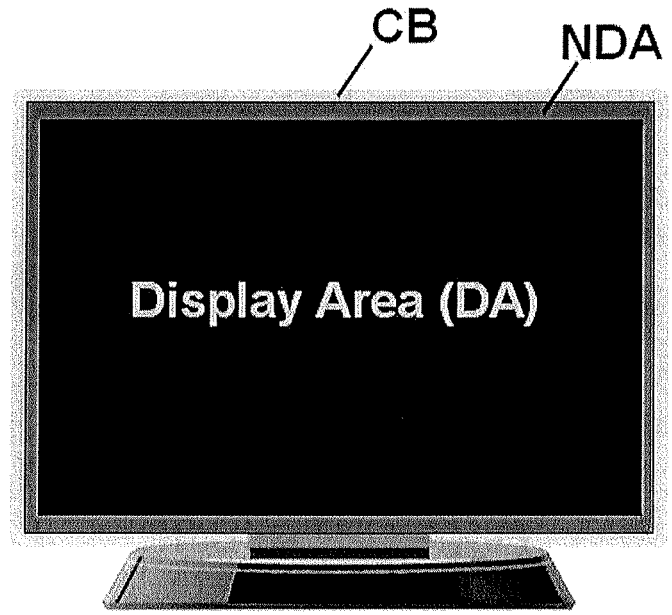
FIGS. 9A and 9B respectively illustrate a related art OLED display device and an OLED display device of the present invention for comparison.
Figure 9B:
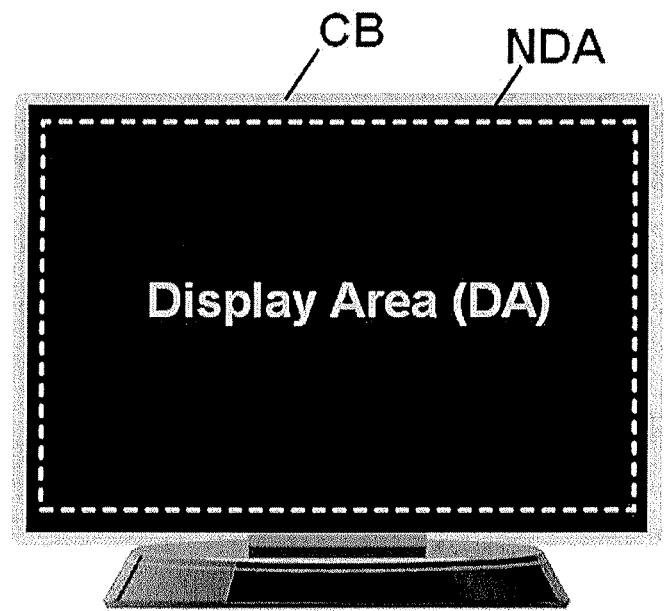

FIGS. 9A and 9B respectively illustrate a related art OLED display device and an OLED display device of the present invention for comparison.

As described before, the OLED display device of the present invention includes a light shielding layer 40, 54 or 56 formed on an outside or an inside of the encapsulation substrate 20 bonded to the device substrate 10, or the heat dissipation sheet 50 or the adhesive 52 attached to the outside surface of the encapsulation substrate 20 given a function of the light shielding layer by treating the heat dissipation sheet 50 or the adhesive 52 to be black, or a light shielding layer 58 formed at the peripheral portion of the encapsulation substrate 20 opposite to the non-display area NDA of the device substrate 10, for making the non-display area NDA of the device substrate 10 non-transparent. Therefore, while the non-display area NDA of the related art OLED display device is seen semi-transparently as shown in FIG. 9A, the non-display area NDA of the OLED display device of the present invention is seen non-transparent black as shown in FIG. 9B, thereby improving a display quality. Moreover, since it is not necessary that the non-transparent non-display area NDA encroaches upon the display area DA of the cabinet CB, reduction of the display area DA is prevented, and fabrication of a thinner flat display device is made possible, owing to reduction of a size of the cabinet.

In the meantime, though the present invention has been described only taking the OLED display device as an example, the light shielding layer for making the non-display area NDA non-transparent is applicable to other flat display devices.

As has been described, the flat display device of the present invention has the following advantages.

The flat display device of the present invention includes a light shielding layer formed on an outside or an inside of the second substrate bonded to the first substrate, or the heat dissipation sheet or the adhesive attached to the outside surface of the second substrate given a function of the light shielding layer by treating the heat dissipation sheet or the adhesive to be black, or a light shielding layer formed at the peripheral portion of the second substrate opposite to the non-display area of the first substrate, for making the non-display area of the first substrate non-transparent. Therefore, while the non-display area of the related art flat display device is seen semi-transparently, the non-display area of the flat display device of the present invention is seen non-transparent black, thereby improving a display quality. Moreover, since it is not necessary that the non-transparent non-display area encroaches upon the display area of the cabinet, reduction of the display area is prevented, and fabrication of a thinner flat display device is made possible, owing to reduction of a size of the cabinet.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A flat display device, comprising:
a single transparent first substrate of defined dimensions with a front surface and a back surface, the front surface of the single transparent first substrate forming a transparent display area and a semi-transparent non-display area that entirely surrounds the transparent display area, the non-display area being formed along a peripheral edge portion of the front surface of the single transparent first substrate;
a pixel matrix and organic luminescence diode devices formed on the back surface of the single transparent first substrate which emit light to display a picture which is centrally disposed in the transparent display area on the front surface of the single transparent first substrate;
a driving circuit for driving the pixel matrix on the back surface of the single transparent first substrate, the driving circuit being positioned directly beneath the semi-transparent non-display area and disposed proximately to the pixel matrix;
a single second substrate with a front surface and a back surface, the front surface of the single second substrate faces the back surface of the single first substrate, a peripheral edge portion of the front surface of the single second substrate having an elevated continuous surrounding edge;
a separate heat dissipation sheet on an entire back surface of the single second substrate, the separate heat dissipation sheet including a light shielding material that covers the entire back surface of the single second substrate and that serves as a light shielding layer and causes the semi-transparent non-display area to appear opaque when being viewed from the front surface of the single transparent first substrate; and
a sealant that bonds the elevated continuous surrounding edge of the front surface of the single second substrate onto only a peripheral edge portion of the back surface of the single transparent first substrate to enable the single second substrate to completely seal and enclose the back surface of the single transparent first substrate without any portion of the front surface of the second substrate directly or indirectly contacting any portion of the driving circuit and the pixel matrix and the organic luminescence diode devices which are formed on the back surface of the single transparent first substrate.

2. The flat display device according to claim 1, wherein the light shielding material is formed on a surface of the separate heat dissipation sheet by processing the surface of the separate heat dissipation sheet to be black.

3. The flat display device according to claim 1, wherein the light shielding material is a non-transparent adhesive for bonding the separate heat dissipation sheet to the single second substrate.

4. The flat display device according to claim 1, wherein the sealant is in direct contact with the single transparent first substrate and the single second substrate.

5. A flat display device, comprising:
- a single transparent first substrate of defined dimensions with a front surface and a back surface, the front surface of the single transparent first substrate forming a transparent display area and a semi-transparent non-display area that entirely surrounds the transparent display area, the non-display area being formed along a peripheral edge portion of the front surface of the single transparent first substrate;
- a pixel matrix and organic luminescence diode devices formed on the back surface of the single transparent first substrate which emit light to display a picture which is centrally disposed in the transparent display area on the front surface of the single transparent first substrate;
- a driving circuit for driving the pixel matrix on the back surface of the single transparent first substrate, the driving circuit being positioned directly beneath the semi-transparent non-display area and disposed directly adjacent to the pixel matrix;
- a single second substrate with a front surface and a back surface, the front surface of the single second substrate faces the back surface of the single first substrate, a peripheral edge portion of the front surface of the single second substrate having an elevated continuous surrounding edge;
- an adhesive light shielding layer on the back surface of the single second substrate, the adhesive light shielding layer including a portion which overlaps the driving circuit and the overlapping portion causes the semi-transparent non-display area to appear opaque when being viewed from the front surface of the single transparent first substrate;
- a separate heat dissipation sheet on the entire back surface of the single second substrate, the separate heat dissipation sheet being adhered to the back surface of the single second substrate by the adhesive light shielding layer; and
- a sealant that bonds the elevated continuous surrounding edge of the front surface of the single second substrate onto only a peripheral edge portion of the back surface of the single transparent first substrate to enable the single second substrate to completely seal and enclose the back surface of the single transparent first substrate without any portion of the front surface of the second substrate directly or indirectly contacting any portion of the driving circuit and the pixel matrix and the organic luminescence diode devices which are formed on the back surface of the single transparent first substrate.

6. The flat display device of claim 5 wherein the adhesive light shielding layer is formed only in the non-display area.

7. The flat display device of claim 1 wherein the separate heat dissipation sheet comprises a sheet of an isotropic material, the isotropic material including at least one of copper, aluminum, and silicon.

8. The flat display device of claim 1 wherein the separate heat dissipation sheet comprises a sheet of graphite.

9. The flat display device of claim 5 wherein the separate heat dissipation sheet comprises a sheet of an isotropic material, the isotropic material including at least one of copper, aluminum, and silicon.

10. The flat display device of claim 5 wherein the separate heat dissipation sheet comprises a sheet of graphite.

11. The flat display device of claim 5 wherein the adhesive light shielding layer comprises a black two-sided tape.

* * * * *